United States Patent [19]

Akazawa et al.

[11] Patent Number: 5,038,013

[45] Date of Patent: Aug. 6, 1991

[54] PLASMA PROCESSING APPARATUS INCLUDING AN ELECTROMAGNET WITH A BIRD CAGE CORE

[75] Inventors: Moriaki Akazawa; Takahiro Maruyama; Toshiaki Ogawa; Hiroshi Morita; Tomoaki Ishida, all of Itami, Japan

[73] Assignee: Mitsubishi Denki Kabushiki Kaisha, Japan

[21] Appl. No.: 562,669

[22] Filed: Aug. 3, 1990

[30] Foreign Application Priority Data

Dec. 19, 1989 [JP] Japan ................................. 1-327384

[51] Int. Cl.⁵ ..................... B23K 9/00; C23C 14/34
[52] U.S. Cl. ........................... 219/121.43; 219/121.4; 156/646; 204/298.17; 204/298.37
[58] Field of Search ........... 219/121.4, 121.43, 121.42; 156/643, 646, 345; 204/298.17, 298.37

[56] References Cited

U.S. PATENT DOCUMENTS 4,761,219  8/1988  Sasaki et al. .................. 204/298.37
4,826,585  5/1989  Davis ............................. 204/298.37
4,911,814  3/1990  Matsuoka et al. ............. 204/298.17

FOREIGN PATENT DOCUMENTS 0158032  7/1986  Japan ............................. 204/298.17
0089663  4/1988  Japan ............................. 204/298.17

OTHER PUBLICATIONS

Deposition of Co-Cr Films by Perpendicular Magnetic Recording Kadokura et al., vol. MAG-17, No. 6, pp. 3175-3177.

Primary Examiner—Mark H. Paschall
Attorney, Agent, or Firm—Leydig, Voit & Mayer

[57] ABSTRACT

A plasma etching apparatus comprises a chamber, a holding table for holding samples, such as a semiconductor substrate to be etched, in the chamber, a plasma-generating device for generating a plasma within the chamber, and a magnetic-field-forming device which forms a magnetic field perpendicular to the surface of the sample placed on the holding table and parallel the inner wall of the chamber.

7 Claims, 3 Drawing Sheets

PLASMA PROCESSING APPARATUS INCLUDING AN ELECTROMAGNET WITH A BIRD CAGE CORE

BACKGROUND OF THE INVENTION

1. FIELD OF THE INVENTION

This invention relates to a plasma etching apparatus and more particularly to improvements in uniformity of etching.

2. DESCRIPTION OF THE RELATED ART

FIG. 5 shows a conventional plasma etching apparatus of a parallel plate electrode type. Within a cylindrical chamber 1 is arranged an upper electrode 2 opposing a lower electrode 3. The upper electrode 2 is grounded and the lower electrode 3 is connected to a high-frequency power source 7 disposed outside of the chamber 1. The lower electrode 3 also serves as a sample table, upon which samples 4 to be etched, such as a semiconductor substrate, are placed. The chamber 1 is provided with a gas inlet 5 and a gas outlet 6. Permanent magnets 8 are arranged in the periphery of the chamber 1 encircling it. As shown in FIG. 6, the permanent magnets 8 are so disposed along the periphery of the chamber 1 that the N and the S poles thereof are alternatingly arranged. With this structure, lines of magnetic force 9 parallel to the surface of the sample 4 are present in the chamber 1.

In operation, reaction gases, such as for example, CF4 and CCl4, are fed through the gas inlet 5 and at the same time the gases are discharged through the outlet 6 to constantly maintain gas pressure in the chamber 1. Under this condition, a high-frequency voltage is applied across the upper and lower electrodes 2, 3 in order to generate a gas plasma within the chamber 1. The gas plasma is enclosed in the magnetic field generated by the permanent magnets 8 so that the surface of the sample 4 placed on the lower electrode 3 is etched by exposure to the gas plasma.

However, as is clear from FIG. 6 since the lines of magnetic force produced by a plurality of permanent magnets 8 for enclosing the plasma go in and out among the permanent magnets 8, the magnetic field intensity of the permanent magnets is unequally distributed along the internal circumference of the chamber 1. Further, because these lines 9 are parallel to the surface of the sample 4, the lines 9 tend to cover the area close to the sample 4. Therefore, the density of the ions and the radicals in the gas plasma also becomes unequal, causing a lower etching rate and non-uniformity of etching. This is a problem with a conventional plasma etching apparatus.

SUMMARY OF THE INVENTION

It is an object of the present invention to overcome the above-described problem in the conventional apparatus, and to provide a plasma etching apparatus for etching with higher uniformity.

The plasma etching apparatus according to this invention comprises a chamber, holding means for holding a sample in the chamber, plasma-generating means for generating a plasma within the chamber, and magnetic-field-forming means for forming a magnetic field perpendicular to the surface of the sample placed on the holding means and along the inner wall of the chamber.

Other features will become apparent from the following the Description of the Preferred Embodiments when read in light of the accompanying drawings.

DESCRIPTION OF THE PREFERRED EMBODIMENTS

An embodiment according to the present invention is described hereinafter in connection with attached drawings.

Figure 1:
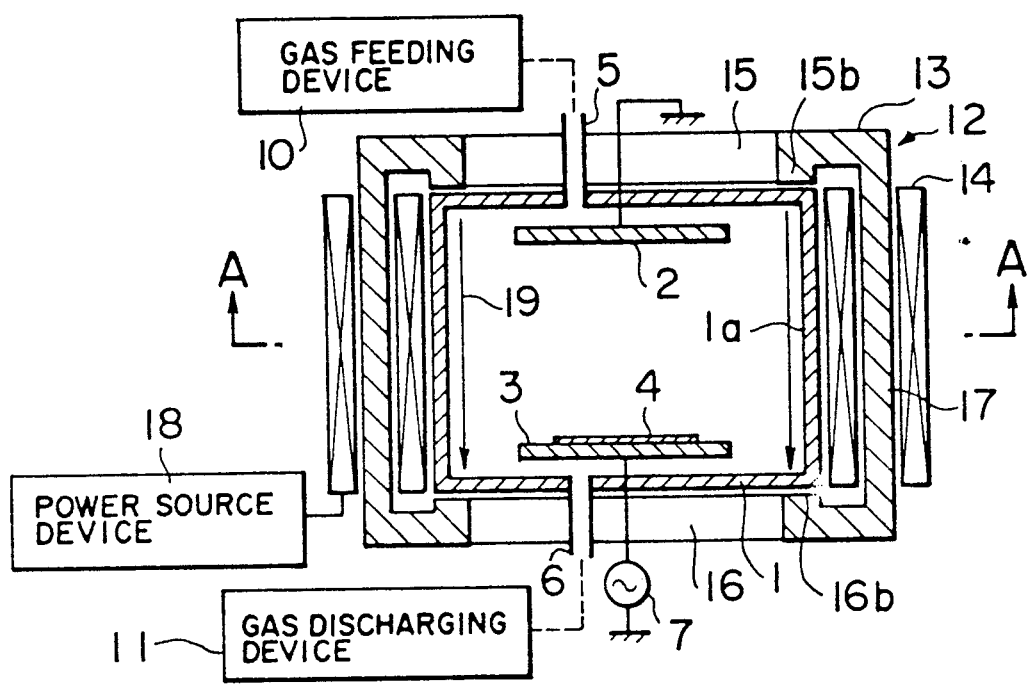
FIG. 1 is a cross-sectional view of a plasma etching apparatus according to the present invention.

As shown in FIG. 1, in a cylindrical chamber 1, an upper electrode 2 is arranged on the central axis of the chamber 1 opposing a lower electrode 3. The upper electrode 2 is grounded and the lower electrode 3 is connected to a high-frequency power source 7 disposed outside of the chamber 1. The lower electrode 3 also is a holding means for holding samples, such as a semiconductor substrate, to be etched. A gas inlet 5 and a gas outlet 6 are provided on the upper and lower sides of the chamber 1, respectively. A gas feeding device 10 is arranged at the gas inlet 5 and a gas discharging device 11 at the gas outlet 6, respectively.

A cylindrical electromagnet 12 is so arranged on the periphery of the chamber 1 surrounding the chamber 1. The electromagnet 12 has a magnetic core 13 made of a ferromagnetic material and a plurality of coils 14 wound around the magnetic core 13. Each coil 14 is connected to a power source device 18.

Figure 2:
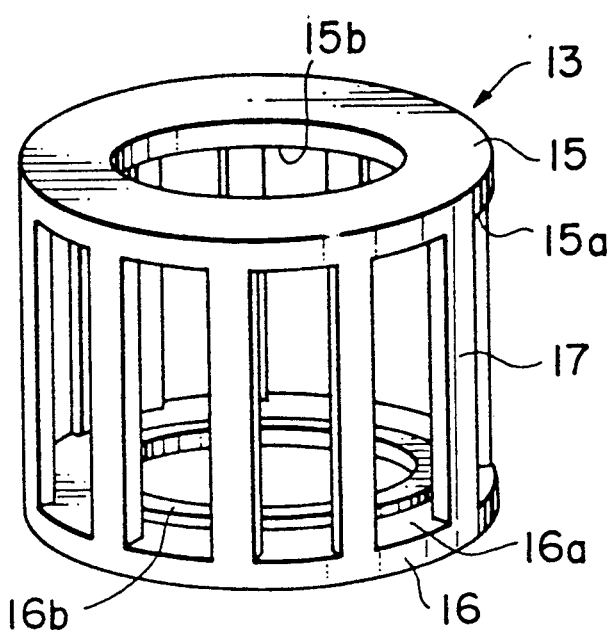
FIG. 2 is a perspective view showing a magnetic core of the embodiment in FIG. 1.
Figure 3:
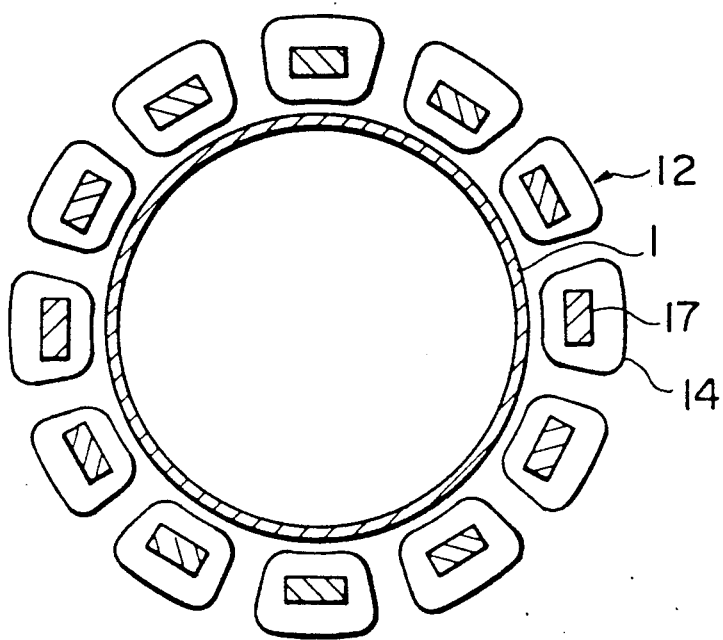
FIG. 3 is a cross-sectional view taken on line A—A of FIG. 1.

As shown in FIG. 2, the magnetic core 13 is provided with a pair of coaxial annular members 15, 16 to opposing each other and a plurality of post members 17 gaining annular members 15, 16. Annular projections 15b, 16b protrude, in a step-like manner, along the inner circumference of the annular members 15 and 16, respectively are arranged on opposite planes 15a, 16a, opposing each other, of the annular members 15, 16. These projections 15b, 16b have substantially the same diameter as the chamber 1 and are arranged across the inner wall 1a of the chamber 1 in relation to the central axis of the chamber 1 as shown in FIG. 1. Further, the coil 14 is wound around each post member 17, respectively, as shown in FIG. 3.

The operation of this embodiment will now be described. A sample 4 to be etched is first placed on the lower electrode 3. The reaction gases, such as CF4 and CCl4, are fed from the gas feeding device 10 through the gas inlet 5 into the chamber 1 and at the same time are discharged from the gas discharging device 11 through the gas outlet 6 in order to keep the gas pressure constant within the chamber 1. Under these conditions, a high-frequency voltage is applied between the upper and lower electrodes 2, 3 from the high-frequency power source 7 and, thereby a gas plasma is generated within the chamber 1.

Direct current of a predetermined amount is applied to each coil 14 of the electromagnet 12 from a power source device 18 to magnetize the magnetic core 13. At this time, the projections 15b, 16b of the magnetic core 13 form a pair of magnetic poles, which generate a magnetic field perpendicular to the surface of the sample 4 and along the surface of the inner wall 1a of the chamber 1, as shown by the lines of magnetic force 19 in FIG. 1. The gas plasma generated in the chamber 1 is enclosed by the magnetic field, and the surface of the sample 4 placed on the lower electrode 3 is etched by exposure to the gas plasma.

The magnetic field for enclosing the gas plasma generated by the electromagnet 12 is concentrated in the only region close to the inner wall 1a of the chamber 1 and at the same time its intensity is distributed uniformly along the inner circumference of the chamber 1. When the sample 4 is placed on the central axis of the chamber 1, the density of ions and radicals in the region close to the sample 4 within the plasma is constant. Consequently, highly uniform etching of the sample 4 is performed.

Figure 4:
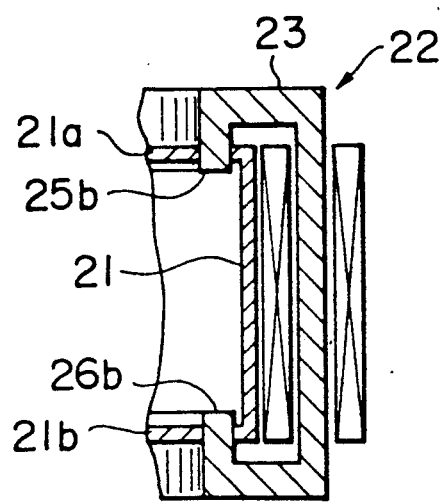
FIG. 4 is a cross-sectional view showing the major components of another embodiment according to the invention.
Figure 5:
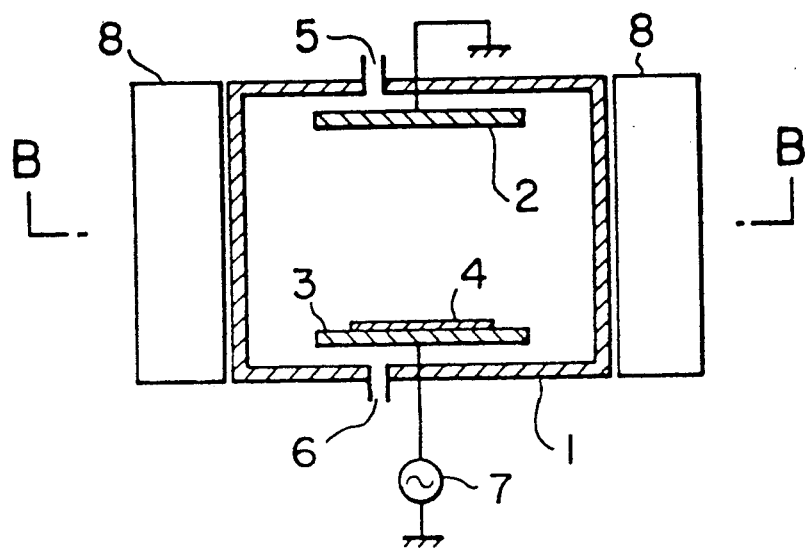
FIG. 5 is a cross-sectional view of a conventional plasma etching apparatus.
Figure 6:
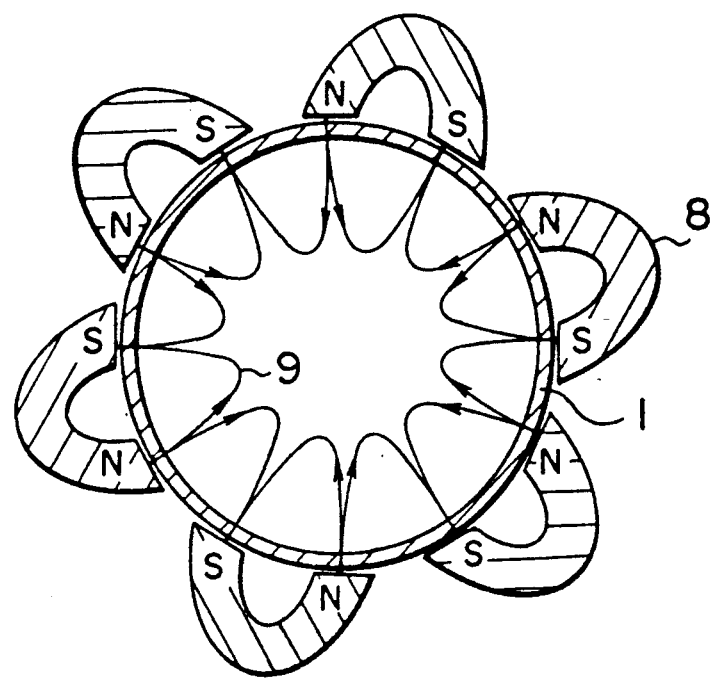
FIG. 6 is a cross-sectional view taken on line B—B of FIG. 5.

As shown in FIG. 4, the apparatus may be constructed so that projections 25b, 26b of a magnetic core 23 of an electromagnet 22 are disposed protruding through upper and lower plates 21a, 21b of a chamber 21.

Instead of containing the electromagnet 12 shown in FIG. 1, the apparatus may also be constructed so that a plurality of electromagnets are arranged along the periphery of the chamber 1 so that a pair of magnetic poles is disposed across the inner wall 1a of the chamber 1 in relation to the central axis of the chamber 1. With this construction, a magnetic field along the inner wall 1a of the chamber 1 is formed. However, use of electromagnets 12, 22 having annular magnetic poles allows highly uniform magnetic field distribution and etching.

The invention described in detail is not limited to a plasma etching apparatus of the parallel plate electrode type, but may apply to other plasma etching apparatus, such as microwave plasma etching apparatus.

What is claimed is:

1. A plasma etching apparatus comprising:

a chamber having a central axis and an inner wall generally parallel to the central axis;

holding means for holding a sample in said chamber generally perpendicular to said inner wall;

plasma-generating means for generating a plasma within said chamber; and magnetic-field-forming means for forming a magnetic field generally perpendicular to a sample placed on said holding means and generally parallel to said inner wall of said chamber comprising a substantially cylindrical electromagnet coaxial with said chamber and including a magnetic core having a pair of annular members disposed generally perpendicular to the central axis and a plurality of post members generally parallel to the central axis joining said pair of annular members, and a plurality of coils, each coil wound around one of said post members of said magnetic core.

2. A plasma etching apparatus according to claim 1, wherein said chamber is cylindrical.

3. A plasma etching apparatus according to claim 1, wherein each of said annular members includes an annular projection protruding along said inner wall of said chamber toward said chamber.

4. A plasma etching apparatus according to claim 3, wherein said projections of said annular members are disposed outside of said chamber.

5. A plasma etching apparatus according to claim 3, wherein said projections of said annular members protrude into said chamber.

6. A plasma etching apparatus according to claim 1, wherein said plasma-generating means comprises a pair of electrode plates coaxial with the central axis of said chamber and disposed within said chamber, opposing each other, a power source for applying a voltage between said pair of electrode plates, a gas feeding device for feeding reaction gases to said chamber and a gas discharging device for discharging gases from said chamber 7. A plasma etching apparatus according to claim 6, wherein said holding means is one of said two electrode plates.

* * * * *